(12) United States Patent
Lee

(10) Patent No.: US 8,309,372 B2
(45) Date of Patent: Nov. 13, 2012

(54) METHOD OF MANUFACTURING STACKED SEMICONDUCTOR PACKAGE

(75) Inventor: Jong-joo Lee, Suwon-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/014,108

(22) Filed: Jan. 26, 2011

(65) Prior Publication Data

US 2011/0183447 A1    Jul. 28, 2011

(30) Foreign Application Priority Data

Jan. 28, 2010  (KR) .................. 10-2010-0008046

(51) Int. Cl.
*H01L 21/66* (2006.01)

(52) U.S. Cl. ............ 438/15; 438/25; 438/106; 438/107; 257/E23.001; 257/E23.011

(58) Field of Classification Search .................. 438/15, 438/25, 106, 107; 257/E23.001, E23.011
See application file for complete search history.

(56) References Cited

U.S. PATENT DOCUMENTS

| | | | | |
|---|---|---|---|---|
| 2001/0026013 A1* | 10/2001 | Mess et al. | .................. | 257/686 |
| 2006/0001179 A1* | 1/2006 | Fukase et al. | .................. | 257/778 |
| 2006/0208348 A1* | 9/2006 | Ohsaka et al. | .................. | 257/685 |
| 2009/0273068 A1* | 11/2009 | Kaskoun et al. | .................. | 257/686 |

FOREIGN PATENT DOCUMENTS

| | | |
|---|---|---|
| JP | 2008-130704 | 6/2008 |
| KR | 10-0851108 | 8/2008 |
| KR | 10-0886517 | 3/2009 |

* cited by examiner

*Primary Examiner* — Julia Slutsker
(74) *Attorney, Agent, or Firm* — Stanzione & Kim, LLP

(57) ABSTRACT

A method of manufacturing a stacked semiconductor package in which a plurality of semiconductor chips are stacked includes preparing a first semiconductor chip including a first semiconductor device, a first penetration electrode, and a first connection unit electrically connected to the first semiconductor device or the first penetration electrode, attaching the first semiconductor chip to a base substrate with the first connection unit interposed therebetween, forming a first rewiring pattern and a first protection layer on the first semiconductor chip by using a printing method, wherein the first rewiring pattern is electrically connected to the first penetration electrode and the first protection layer partially covers the first rewiring pattern and exposes other portions of the first rewiring pattern, and attaching a second semiconductor chip including a second semiconductor device to the first semiconductor chip to electrically connect the second semiconductor device to the first rewiring pattern.

10 Claims, 19 Drawing Sheets

METHOD OF MANUFACTURING STACKED SEMICONDUCTOR PACKAGE

CROSS-REFERENCE TO RELATED APPLICATIONS

This application claims priority under 35 U.S.C. §119 from Korean Patent Application No. 10-2010-0008046, filed on Jan. 28, 2010, in the Korean Intellectual Property Office, the disclosure of which is incorporated herein in its entirety by reference.

BACKGROUND

1. Field of the General Inventive Concept

The present general inventive concept relates to a method of manufacturing a semiconductor package, and more particularly, to a method of manufacturing a stacked semiconductor package in which a plurality of semiconductor chips are stacked.

2. Description of the Related Art

Due to rapid development of the electronics industry, semiconductor devices have increasingly high speed and high performance. Accordingly, in order for semiconductor devices to satisfy both high speed and high performance, the degree of integration of the semiconductor devices is being increased. However, a miniaturizing process for increasing the degree of integration of the semiconductor devices becomes increasingly more difficult and a high-cost is required.

SUMMARY

The present general inventive concept provides a method of manufacturing a stacked semiconductor package in which a plurality of semiconductor chips are stacked.

The present general inventive concept provides a method of manufacturing a stacked semiconductor package, the method including preparing a first semiconductor chip including a first semiconductor device, a first penetration electrode, and a first connection unit electrically connected to the first semiconductor device or the first penetration electrode, attaching the first semiconductor chip to a base substrate with the first connection unit interposed therebetween, forming a first rewiring pattern and a first protection layer on the first semiconductor chip by using a printing method, wherein the first rewiring pattern is electrically connected to the first penetration electrode and the first protection layer partially covers the first rewiring pattern and exposes other portions of the first rewiring pattern, and attaching a second semiconductor chip including a second semiconductor device to the first semiconductor chip to electrically connect the second semiconductor device to the first rewiring pattern.

The first semiconductor chip may include a first surface and a second surface that is opposite to the first surface, the first semiconductor device and the first connection unit may be formed on the first surface, and in the attaching of the first semiconductor chip to the base substrate, the first surface may face the base substrate.

The forming of the first rewiring pattern and the first protection layer by using a printing method may include forming the first rewiring pattern and the first protection layer on the second surface of the first semiconductor chip and the attaching of the second semiconductor chip to the first semiconductor chip may include attaching the second semiconductor chip to the second surface of the first semiconductor chip.

The base substrate may be a first printed circuit board including a first conductive wiring and the attaching of the first semiconductor chip to the base substrate may include electrically connecting the first connection unit to the first conductive wiring.

The second semiconductor chip may further include second connection units that are electrically connected to the second semiconductor device, and the second semiconductor device may be electrically connected to the first conductive wiring through the second connection units, the first penetration electrode, and the first connection unit The method may further include testing the first semiconductor chip attached to the first printed circuit board before the attaching of the second semiconductor chip to the first semiconductor chip.

The printing of the first rewiring pattern and the first protection layer may include inkjet printing or stencil printing.

A surface of the second semiconductor chip on which the second semiconductor device is formed may be larger than a surface of the first semiconductor chip on which the first semiconductor device is formed.

A surface of the base substrate to which the first semiconductor chip is attached may be larger than the surface of the second semiconductor chip on which the second semiconductor device is formed.

In the forming of the first rewiring pattern and the first protection layer by using a printing method, the first protection layer may be formed to be spaced apart from an edge of a surface of the first semiconductor chip on which the first rewiring pattern and the first protection layer are formed.

BRIEF DESCRIPTION OF THE DRAWINGS

These and/or other features and utilities of the present general inventive concept will be more clearly understood from the following detailed description taken in conjunction with the accompanying drawings in which.

DETAILED DESCRIPTION OF THE EMBODIMENTS

Hereinafter, a method of manufacturing a semiconductor device according to embodiments of the present general inventive concept will be described in more detail with reference to the accompanying drawings. The present general inventive concept may, however, be embodied in many different forms and should not be construed as being limited to the embodiments set forth herein. That is, specific structural and functional details disclosed herein are merely representative for purposes of describing exemplary embodiments. This general inventive concept may, however, may be embodied in many alternate forms and should not be construed as limited to only the exemplary embodiments set forth herein. It should be understood, however, that there is no intent to limit exemplary embodiments to the particular forms disclosed, but on the contrary, exemplary embodiments are to cover all modifications, equivalents, and alternatives falling within the scope of the general inventive concept.

It will be understood that, although the terms first, second, third, etc., may be used herein to describe various elements, these elements should not be limited by these terms. These terms are only used to distinguish one element from another element. For example, a first element could be termed a second element without departing from the teachings of exemplary embodiments. Similarly, a second element could be termed a first element.

The terminology used herein is for the purpose of describing particular embodiments only and is not intended to be limiting of exemplary embodiments. The singular forms are intended to include the plural forms as well, unless the context clearly indicates otherwise. It will be further understood that the terms "comprises" and/or "comprising" when used in this specification, specify the presence of stated features, integers, steps, operations, elements, and/or groups thereof, but do not preclude the presence or addition of one or more other features, integers, steps, operations, elements, and/or groups thereof.

Unless defined differently, all terms used in the description including technical and scientific terms have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

Figure 1:
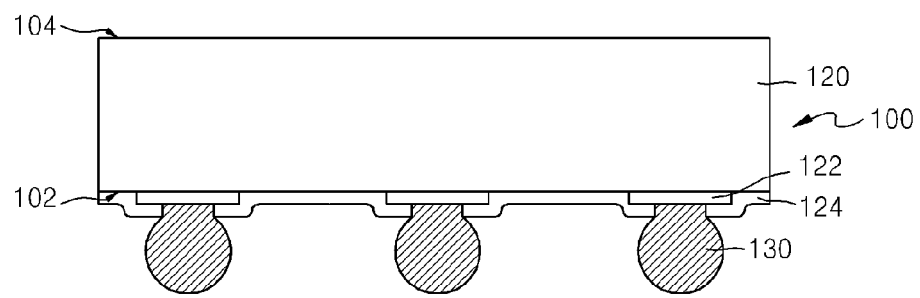
FIG. 1 is a cross-sectional view schematically illustrating a first semiconductor chip to manufacture a stacked semiconductor package according to an embodiment of the present general inventive concept.

FIG. 1 is a cross-sectional view schematically illustrating a first semiconductor chip 100 to manufacture a stacked semiconductor package according to an embodiment of the present general inventive concept.

Referring to FIG. 1, the first semiconductor chip 100 includes a first semiconductor substrate 120, a first pad 122, a first pad protection layer 124, and first connection units 130, wherein the first pad 122, the first pad protection layer 124, and the first connection units 130 are formed on one side 102 of the first semiconductor substrate 120. The first pad 122 is electrically connected to a first semiconductor device (not illustrated) in the first semiconductor chip 100 and the first connection units 130 and thus the first semiconductor device and the first connection units 130 may be electrically connected to each other. Also, a rewiring circuit may be interposed between the first pad 122 and the first semiconductor device.

The first pad protection layer 124 is formed on the first pad 122 so as to prevent the first pad 122 from being exposed to outside elements while partially exposing the first pad 122 so as for the first connection units 130 to be attached on the first pad 122. That is, the first pad protection layer 124 partially exposes the first pad 122 and covers the remaining portions of the first pad 122.

The first connection units 130 may electrically connect the first semiconductor device (not illustrated) to external devices or other semiconductor chips. The first connection units 130 may be, for example, bumps, solder balls, bumps formed on the first pad 122, or solder balls formed on the bumps on the first pad 122.

The first semiconductor chip 100 may have any of various structures and a method of manufacturing the first semiconductor chip 100 will be described in more detail later.

Figure 2:
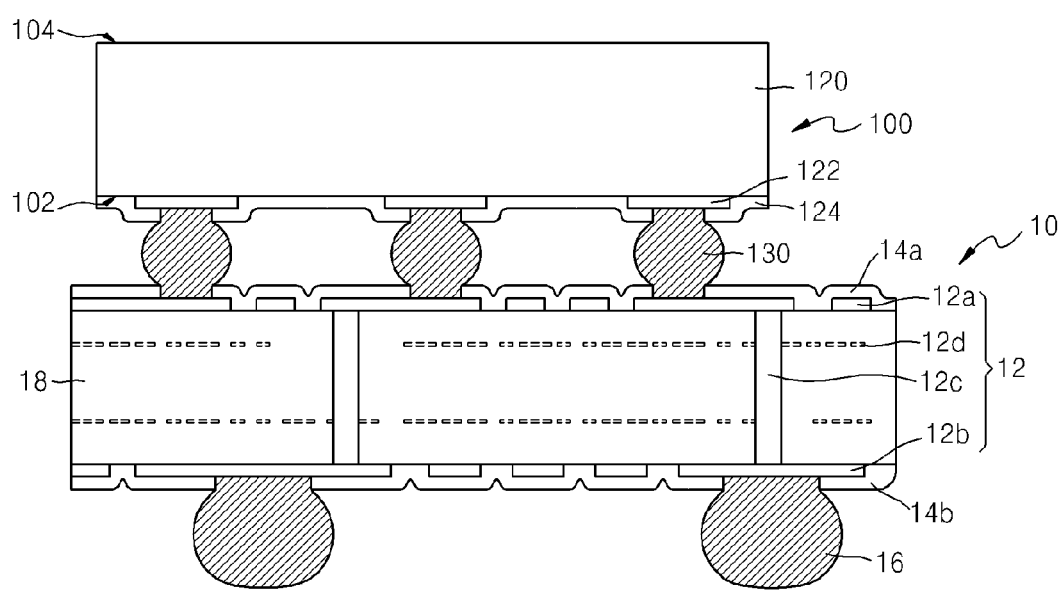
FIG. 2 is a cross-sectional view schematically illustrating the first semiconductor chip of FIG. 1 attached on a first printed circuit board to manufacture a stacked semiconductor package according to an embodiment of the present general inventive concept.

FIG. 2 is a cross-sectional view schematically illustrating the first semiconductor chip 100 attached on a first printed circuit board 10 to manufacture a stacked semiconductor package according to an embodiment of the present general inventive concept.

Referring to FIG. 2, the first semiconductor chip 100 is attached on the first printed circuit board 10. The first printed circuit board 10 may include a first insulating board 18, a first conductive wiring 12, first surface protection layers 14a and 14b, and first outside connection units 16. The first conductive wiring 12 may include a first upper surface wiring 12a, a first lower surface wiring 12b, and a first penetration wiring 12c penetrating a part of or all of the first insulating board 18, wherein the first upper surface wiring 12a and the first lower surface wiring 12b are formed on the upper surface and lower surface of the first insulating board 18, respectively. The first insulating board 18 may include multi-layered insulating film. In this case, first inside wirings 12d may be further formed between each layer of the insulating film included in the first insulating board 18.

The first surface protection layers 14a and 14b may be the first upper surface protection layer 14a and the first lower surface protection layer 14b, respectively, which cover and protect all or part of the first upper surface wiring 12a and the first lower surface wiring 12b, respectively.

Portions of the first upper surface wiring 12a exposed by the first upper surface protection layer 14a may function as a pad to which the first semiconductor chip 100 is attached. That is, portions of the first upper surface wiring 12a exposed by the first upper surface protection layer 14a may contact the first connection units 130 of the first semiconductor chip 100 to electrically connect the first connection unit 130 to the first conductive wiring 12. Accordingly, the first semiconductor device included in the first semiconductor chip 100 may be electrically connected with the first conductive wiring 12.

Portions of the first lower surface wiring 12b exposed by the first lower surface protection layer 14b may function as a pad to which the first outside connection units 16 for electric connection to an external circuit or an external device are attached. That is, portions of the first lower surface wiring 12b exposed by the first lower surface protection layer 14b may contact the first outside connection units 16 for electric connection to an external circuit or an external device.

Figure 3:
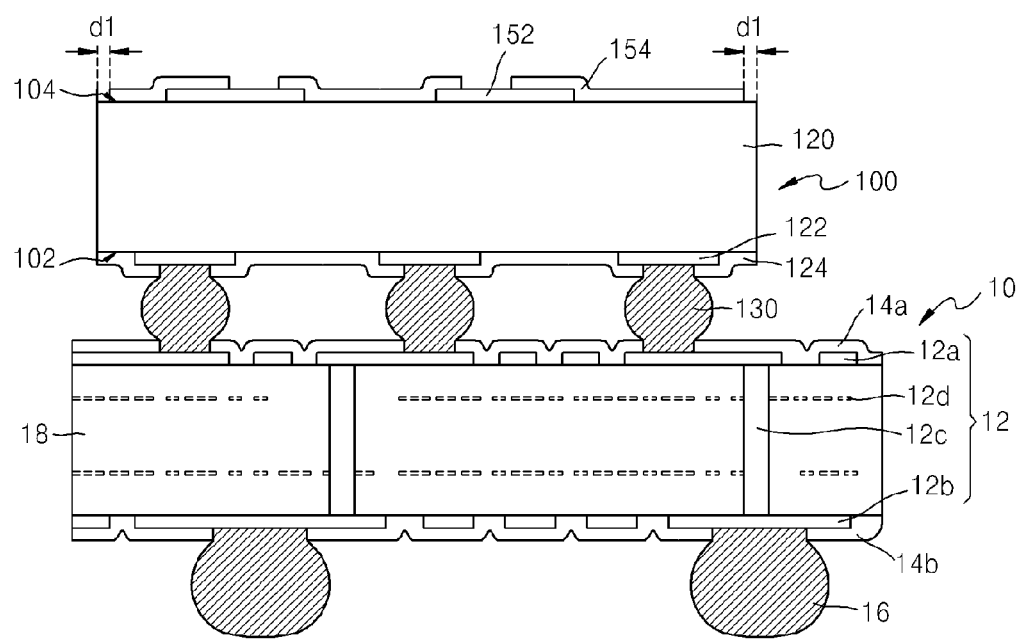
FIG. 3 is a cross-sectional view schematically illustrating a first rewiring pattern and a first protection layer formed on the first semiconductor chip of FIG. 1 to manufacture a stacked semiconductor package according to an embodiment of the present general inventive concept.

FIG. 3 is a cross-sectional view schematically illustrating a first rewiring pattern 152 and a first protection layer 154 formed on the first semiconductor chip 100 to manufacture a stacked semiconductor package according to an embodiment of the present general inventive concept.

Referring to FIG. 3, the first rewiring pattern 152 and the first protection layer 154 are formed on the other side 104 of the first semiconductor substrate 120 of the first semiconductor chip 100 by using a printing method. The printing method may be, for example, an inkjet printing method or a stencil printing method.

The first rewiring pattern 152 may be formed, for example, by inkjet printing or stencil printing. More specifically, a conductive ink is inkjet printed on the other side 104 of the first semiconductor substrate 120 and then the printed conductive ink is selectively heat treated so as to form first rewiring pattern 152. More specifically, a first rewiring mold is a negative form of the first rewiring pattern 152 and is disposed on the other side 104 of the first semiconductor substrate 120 and then a conductive ink is printed on the other side 104 of the first semiconductor substrate 120 by using a scraper. Then the printed conductive ink is selectively heat treated to thereby form the first rewiring pattern 152.

The first protection layer 154 may be formed by, for example, inkjet printing or stencil printing. More specifically, an insulating ink is inkjet printed on the other side 104 of the first semiconductor substrate 120, on which the first rewiring pattern 152 is formed, and then the printed insulating ink is selectively heat treated to thereby form the first protection layer 154. More specifically, a first protection layer mold is a negative form of the first protection layer 154 and is disposed on the other side 104 of the first semiconductor substrate 120, on which the first rewiring pattern 152 is formed, and then an insulating ink is printed on the other side 104 of the first semiconductor substrate 120 by using a scraper. Then the printed insulating ink is selectively heat treated to thereby form the first protection layer 154.

The first protection layer 154 may be formed to partially cover the first rewiring pattern 152 while exposing remaining portions of the first rewiring pattern 152. The exposed portions of the first rewiring pattern 152 may be used as pads to which connection members, such as other semiconductor chips, bumps, or solder balls, are attached.

Also, the exposed portions of the first rewiring pattern 152 may be used to test the first semiconductor chip 100 attached to the first printed circuit board 10. Accordingly, a fail of the first semiconductor chip 100 or a contact fail between the first semiconductor chip 100 and the first printed circuit board 10, which may be generated while attaching the first semiconductor chip 100 to the first printed circuit board 10, may be determined. Thus, defective products may be removed before attaching a second semiconductor chip, which will be described later, to the first semiconductor chip 100 and thus productivity may be improved.

When the first rewiring pattern 152 or the first protection layer 154 are formed by using a printing method such as an inkjet printing method or a stencil printing method, an edge of the first rewiring pattern 152 or the first protection layer 154 may be formed to be spaced apart from an edge of the first semiconductor chip 100, that is, an edge of the other side 104 of the first semiconductor substrate 120.

The first rewiring pattern 152 is mainly formed on the other side 104 of the first semiconductor substrate 120 in such a way that most first rewiring pattern 152 may be formed to be spaced apart from the edge of the other side 104 of the first semiconductor substrate 120.

The first protection layer 154 may be formed to mostly cover the other side 104 of the first semiconductor substrate 120, except for the exposed portions of the first rewiring pattern 152. In this case, the first protection layer 154 may be formed to have a space interval (d1) from the edge of the other side 104 of the first semiconductor substrate 120. That is, the first protection layer 154 may not be formed on portions within the space interval d1 from the edge of the other side 104 of the first semiconductor substrate 120.

In a general method of forming a protection layer used in a general semiconductor manufacturing process or semiconductor package manufacturing process, a material layer such as a nitride film is deposited all over the surface and a part of the material layer is removed, if necessary. Thus, the material layer may be formed on the edge of the surface on which the material layer is formed and thereby a problem such as sidewall contamination may occur.

However, if the printing method described above is used, the first protection layer 154 is formed to have the space interval d1 from the edge of the other side 104 of the first semiconductor substrate 120, on which the first protection layer 154 is formed, without a separate removing process and thus a problem such as sidewall contamination may not occur.

Also, in order to partially expose the first rewiring pattern 152 and to not have to perform a separate removing of the first protection layer 154, the first protection layer 154 may not ever be formed on the portions of the first rewiring pattern 152 to be exposed so that a process may be simplified, thereby resulting in productivity improvement and cost reduction.

When the first protection layer 154 is formed by stencil printing, the first protection layer mold is formed to cover the portions within the space interval d1 from the edge of the other side 104 of the first semiconductor substrate 120 so that the first protection layer 154 may not be formed on the portions within the space interval d1 from the edge of the other side 104 of the first semiconductor substrate 120.

Figure 4:
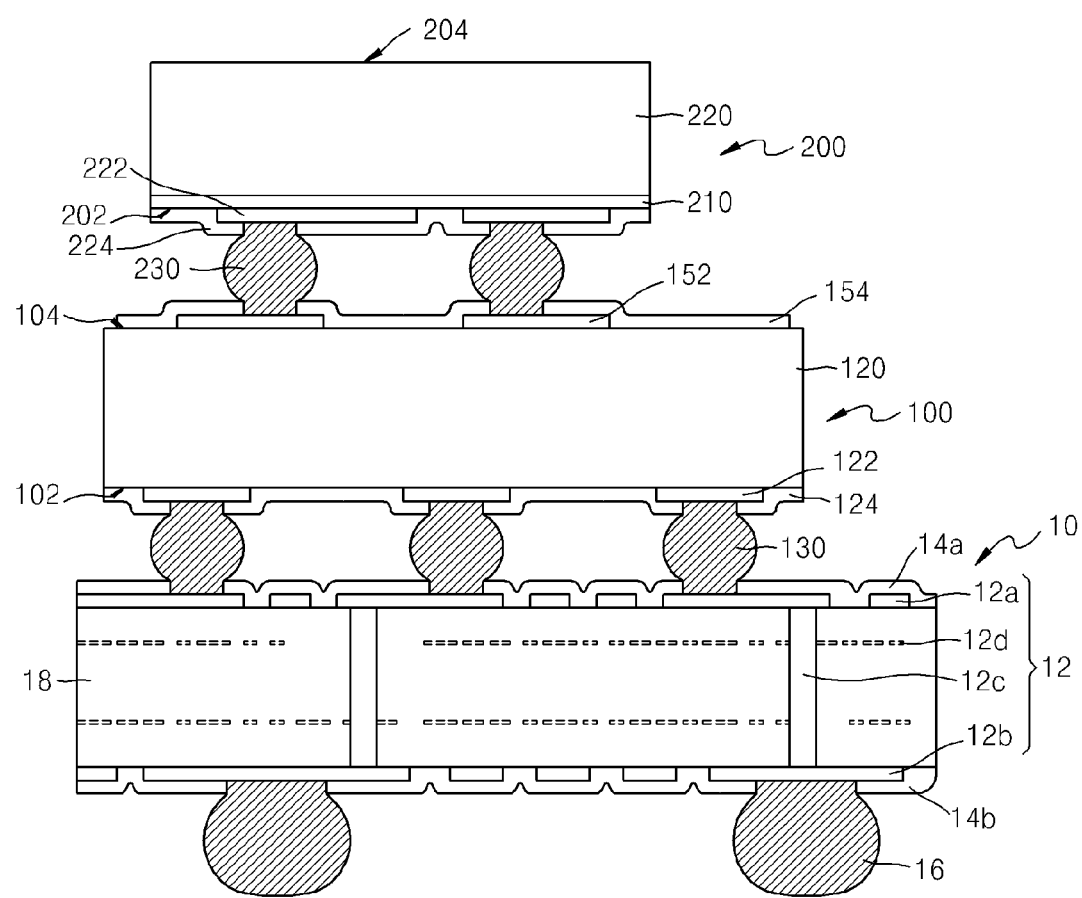
FIGS. 4 and 5 are cross-sectional views schematically illustrating second semiconductor chips attached on the first semiconductor chip of FIG. 1, respectively, to manufacture a stacked semiconductor package according to embodiments of the present general inventive concept.
Figure 5:
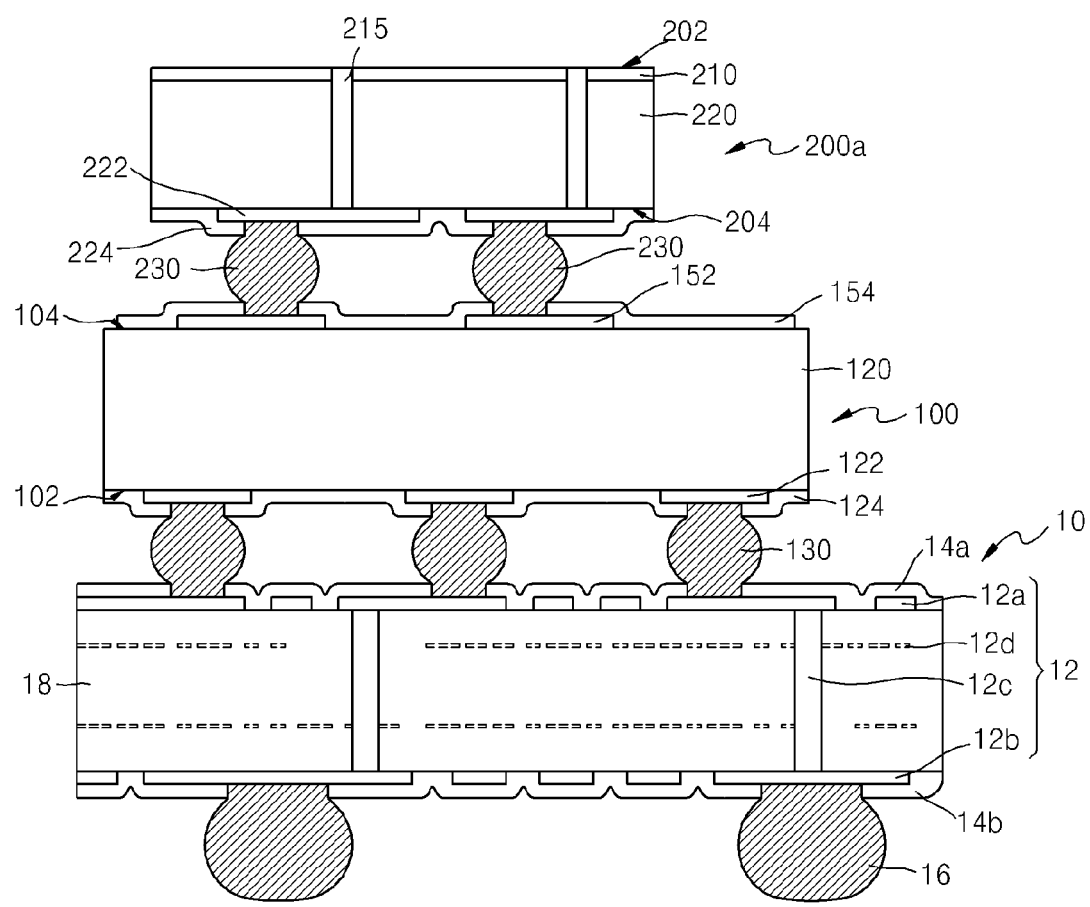

FIGS. 4 and 5 are cross-sectional views schematically illustrating second semiconductor chip 200 and 200a attached on the first semiconductor chip 100, respectively, to manufacture a stacked semiconductor package according to embodiments of the present general inventive concept.

Referring to FIGS. 4 and 5, the second semiconductor chips 200 and 200a are attached on the first semiconductor chip 100, respectively. The second semiconductor chips 200 and 200a may each include a second semiconductor substrate 220, a second pad 222, a second pad protection layer 224, and second connection units 230, wherein the second pad 222, the second pad protection layer 224, and the second connection units 230 are formed on one side 202 of the second semiconductor substrate 220. The second pad 222 may be electrically connected to a second semiconductor device 210 formed in the one side 202 of each of the second semiconductor chips 200 and 200a and thus the second semiconductor device 210 and the second connection units 230 may be electrically connected to each other. Also, a rewiring circuit may be interposed between the second pad 222 and the second semiconductor device 210.

The second pad protection layer 224 is formed on the second pad 222 so as to prevent the second pad 222 from being exposed to outside elements while partially exposing the second pad 222 so as for the second connection units 230 to be attached on the second pad 222. That is, the second pad protection layer 224 partially exposes the second pad 222 and covers the remaining portions of the second pad 222. The second connection units 230 are attached to the exposed portions of the first rewiring pattern 152 and thus may connect the first semiconductor chip 100 to the second semiconductor chips 200 and 200a. That is, the first semiconductor chip 100 may be electrically connected to the second semiconductor chips 200 and 200a with the second connection units 230 interposed therebetween.

Comparing FIG. 4 to FIG. 5, second penetration electrodes 215 are further formed in the second semiconductor chip 200a of FIG. 5. That is, the semiconductor chip 200a of FIG. 5 includes the second penetration electrodes 215, which penetrate the second semiconductor substrate 220 so as to connect the one side 202 with the other side 204 of the semiconductor chip 200a and are electrically connected to the semiconductor device 210. The second semiconductor chip 200 of FIG. 4 may be attached to the first semiconductor chip 100 in such a way that the one side 202, on which the second semiconductor device 210 of the second semiconductor chip 200 is formed, faces the first semiconductor chip 100, whereas the second semiconductor chip 200a of FIG. 5 may be attached to the first semiconductor chip 100 in such a way that the other side 204, which is opposite to the one side 202 and on which the second semiconductor device 210 of the second semiconductor chip 200a is formed, faces the first semiconductor chip 100.

Any one of the second semiconductor chip 200 of FIG. 4 and the second semiconductor chip 200a of FIG. 5 may be selected, as well as replaced with each other, when described later and thus reference numerals and names of elements thereof are commonly illustrated.

FIGS. 6 through 10 are cross-sectional views illustrating manufacturing of a first semiconductor chip 100a to manufacture a stacked semiconductor package according to an embodiment of the present general inventive concept.

Figure 6:
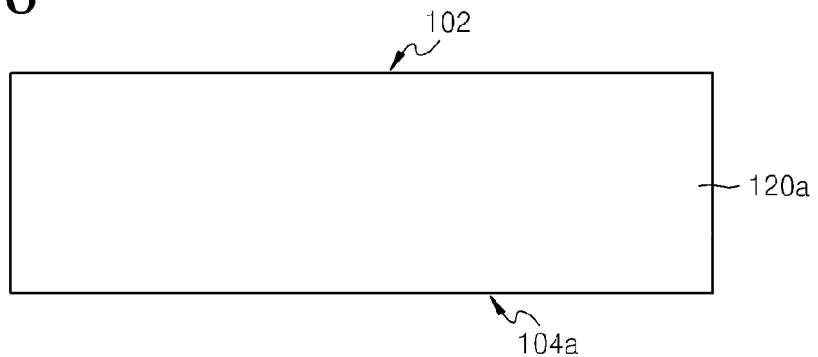
FIGS. 6 through 10 are cross-sectional views illustrating manufacturing of a first semiconductor chip to manufacture a stacked semiconductor package according to an embodiment of the present general inventive concept.

FIG. 6 illustrates preparation of a first preparation semiconductor substrate 120a to manufacture a stacked semiconductor package according to an embodiment of the present general inventive concept.

Referring to FIG. 6, the first preparation semiconductor substrate 120a having a first surface 102 and a second surface 104a that is opposite to the first surface 102 is prepared. The first preparation semiconductor substrate 120a may be a general semiconductor substrate, for example, a silicon substrate. The first preparation semiconductor substrate 120a may also be a semiconductor wafer, which may generate a plurality of semiconductor chips. However, for convenience of description, the first preparation semiconductor substrate 120a denotes one semiconductor chip that may be manufactured from a semiconductor wafer. Accordingly, a process of separating a semiconductor chip from a semiconductor wafer that may generate a plurality of semiconductor chips may be omitted.

Figure 7:
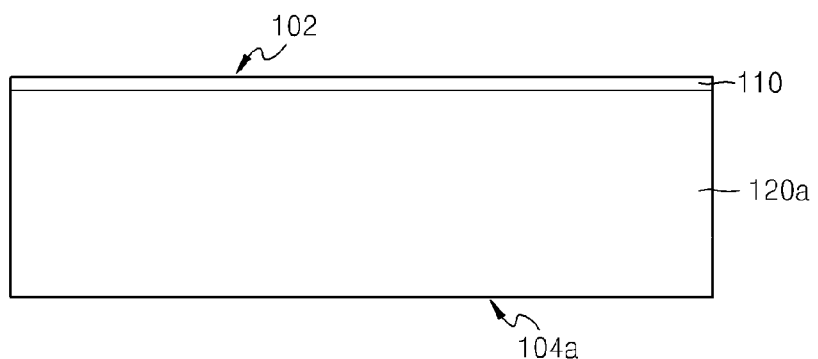

FIG. 7 illustrates a first semiconductor device 110 formed on the first surface 102 to manufacture a stacked semiconductor package according to an embodiment of the present general inventive concept.

Referring to FIG. 7, the first semiconductor device 110 is formed on the first surface 102 of the first preparation semiconductor substrate 120a. The first semiconductor device 110 may include any semiconductor devices that may be manufactured using a semiconductor substrate. The first semiconductor device 110 may include, for example, a memory device, a logic device, a light emitting device, or a light detecting device.

Here, the first semiconductor device 110 does not denote a unit device such as a transistor, a memory cell, or resistance capacitor and instead denotes an integration circuit manufactured in such a way that a plurality of unit devices are integrated.

Figure 8:
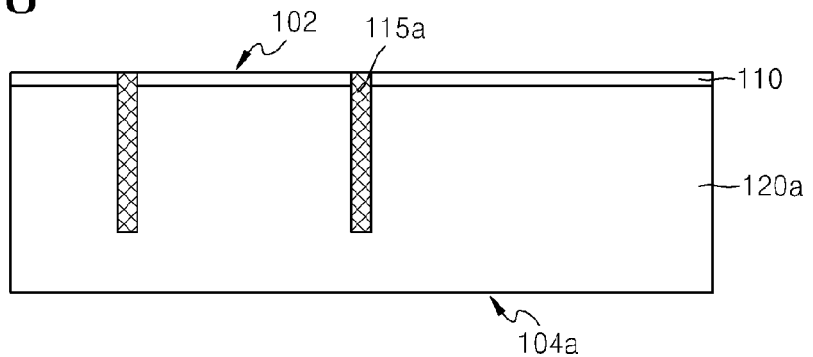

FIG. 8 illustrates first preparation penetration electrodes 115a formed in the first preparation semiconductor substrate 120a to manufacture a stacked semiconductor package according to an embodiment of the present general inventive concept.

Referring to FIG. 8, the first preparation penetration electrodes 115a inserted into the first preparation semiconductor substrate 120a from the first surface 102 of the first preparation semiconductor substrate 120a are formed. The first preparation penetration electrodes 115a may be formed to penetrate the first preparation semiconductor substrate 120a to connect the first surface 102 to the second surface 104a.

Otherwise, the first preparation penetration electrodes 115a may be formed to be inserted into the first preparation semiconductor substrate 120a from the first surface 102 of the first preparation semiconductor substrate 120a and then the first preparation semiconductor substrate 120a may be partially removed from the second surface 104a, thereby exposing the first preparation penetration electrodes 115a. The first preparation penetration electrodes 115a may be formed electrically insulated from the first semiconductor device 110.

Figure 9:
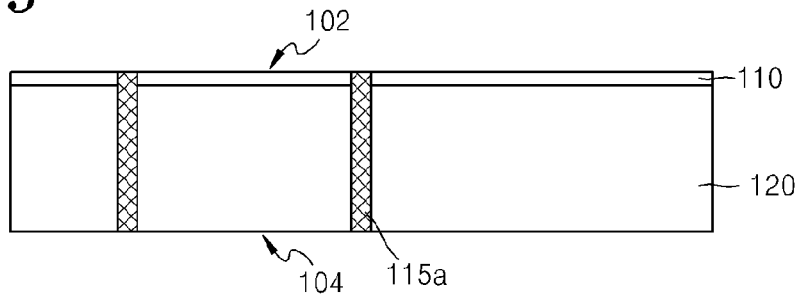

FIG. 9 illustrates back surface grinding to manufacture a stacked semiconductor package according to an embodiment of the present general inventive concept.

Referring to FIGS. 8 and 9, the first preparation penetration electrodes 115a are exposed by back grinding the second surface 104a of the first preparation semiconductor substrate 120a. Here, portions of the first preparation penetration electrodes 115a may also be removed. Accordingly, the results obtained after back grinding are referred to as the first semiconductor substrate 120 and first penetration electrodes 115. A surface opposite to the first surface 102 of the first semiconductor substrate 120 is referred to as the second surface 104.

Figure 10:
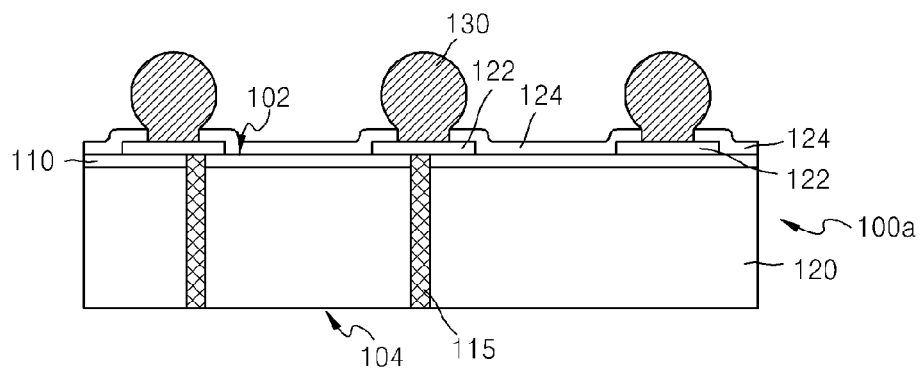

FIG. 10 illustrates attaching of the first connection units 130 to the first semiconductor substrate 120 to manufacture a stacked semiconductor package according to an embodiment of the present general inventive concept.

Referring to FIG. 10, a plurality of first pads 122 and the first pad protection layer 124 are formed on the first surface 102 of the first semiconductor substrate 120. The plurality of first pads 122 may be electrically connected to the first semiconductor device 110 or the first penetration electrodes 115. The plurality of first pads 122 may be partially exposed by the first pad protection layer 124 and the first connection units 130 may be attached to the exposed portions of the plurality of first pads 122. Accordingly, manufacturing of the first semiconductor chip 100a may be completed.

Figure 11:
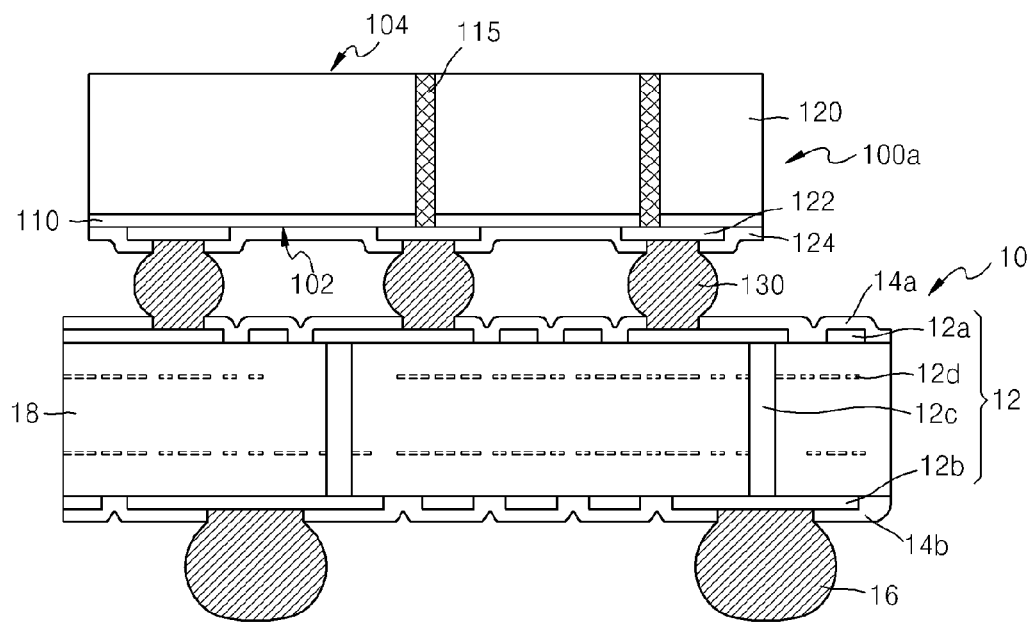
FIG. 11 is a cross-sectional view schematically illustrating the first semiconductor chip of FIG. 10 attached on the first printed circuit board of FIG. 2 to manufacture a stacked semiconductor package according to an embodiment of the present general inventive concept.

FIG. 11 is a cross-sectional view schematically illustrating the first semiconductor chip 100a attached on the first printed circuit board 10 to manufacture a stacked semiconductor package according to an embodiment of the present general inventive concept. More specifically, FIG. 11 illustrates the first semiconductor chip 100a of FIG. 10 as the first semiconductor chip 100 of FIG. 2.

Referring to FIG. 11, the first semiconductor chip 100a is attached on the first printed circuit board 10. Here, the first connection units 130 may be interposed between the first semiconductor chip 100a and the printed circuit board 10 to connect the first semiconductor chip 100a to the first printed circuit board 10. That is, the first semiconductor chip 100a may be attached to the first printed circuit board 10 in such a way that the first surface 102 of the first semiconductor chip 100a faces the first printed circuit board 10.

Here, the first connection units 130 that are connected to the first penetration electrodes 115 may electrically connect other semiconductor chips to be stacked on the first semiconductor chip 100a to the first printed circuit board 10. Also, the first connection units 130 that are not connected to the first penetration electrodes 115 may electrically connect the first semiconductor device 110 with the first printed circuit board 10.

Figure 12:
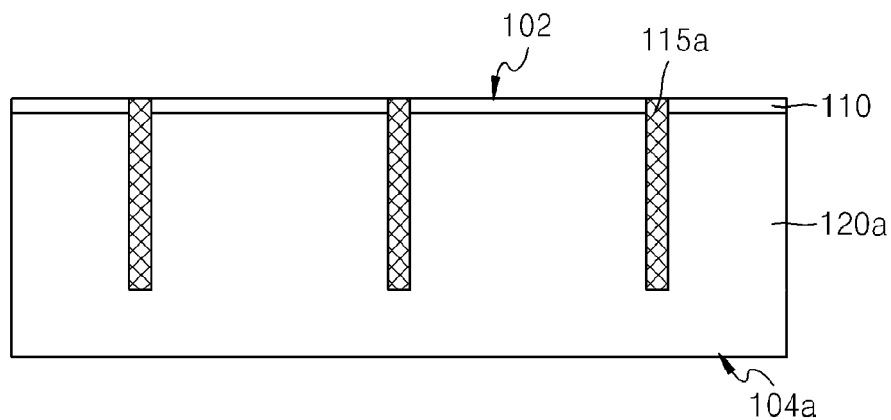
FIGS. 12 through 14 are cross-sectional views illustrating manufacturing of a first semiconductor chip to manufacture a stacked semiconductor package according to another embodiment of the present general inventive concept.
Figure 13:
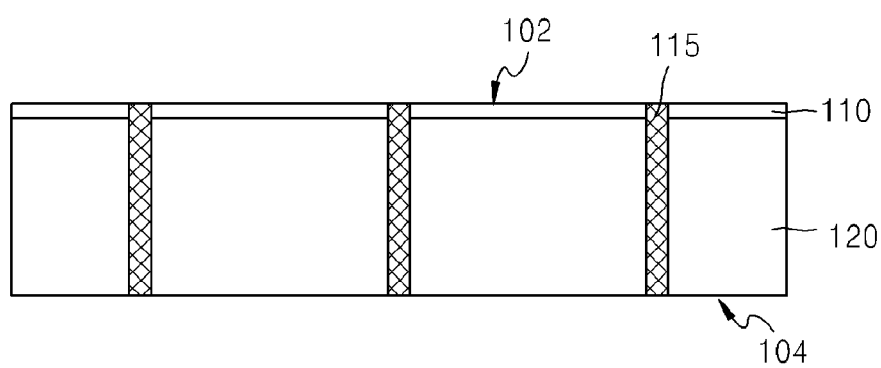
Figure 14:
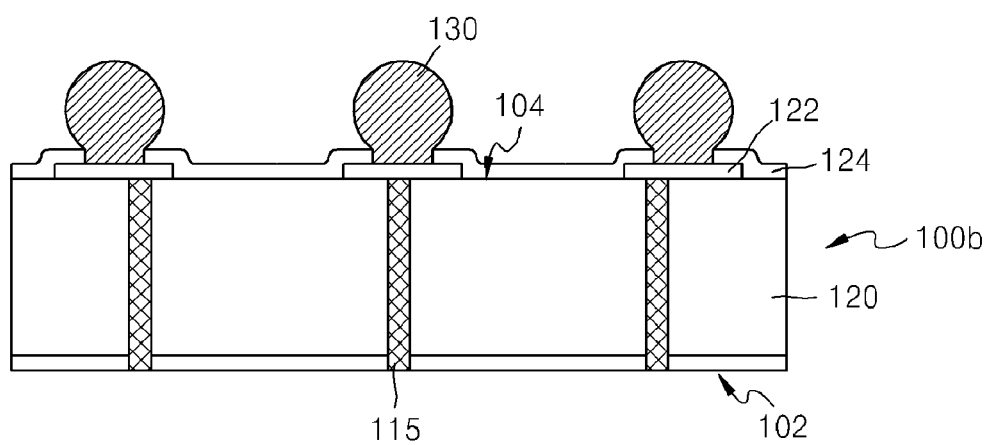

FIGS. 12 through 14 are cross-sectional views illustrating manufacturing of a first semiconductor device 100b to manufacture a stacked semiconductor package according to another embodiment of the present general inventive concept.

FIG. 12 illustrates preparation of first preparation penetration electrodes according to an embodiment of the present general inventive concept. More specifically, FIG. 12 illustrates a process succeeding FIGS. 6 and 7.

Referring to FIG. 12, the first preparation penetration electrodes 115a inserted into the first preparation semiconductor substrate 120a from the first surface 102 of the first preparation semiconductor substrate 120a are formed. Portions of the first preparation penetration electrodes 115a may be formed electrically insulated from the first semiconductor device 110. That is, portions of the first preparation penetration electrodes 115a may be electrically connected to the first semiconductor device 110 and the remaining portions may be electrically insulated from the first semiconductor device 110.

Accordingly, more first preparation penetration electrodes 115a may be formed in the manufacturing of the first semiconductor chip 100b illustrated in FIGS. 12 through 14 than in the manufacturing of the first semiconductor chip 100a illustrated in FIGS. 6 through 10.

FIG. 13 illustrates back surface grinding to manufacture a stacked semiconductor package according to an embodiment of the present general inventive concept.

Referring to FIGS. 12 and 13, the first preparation penetration electrodes 115a are exposed by back grinding the second surface 104a of the first preparation semiconductor substrate 120a. Here, portions of the first preparation penetration electrodes 115a may also be removed. Accordingly, the results obtained after back grinding are referred to as the first semiconductor substrate 120 and the first penetration electrodes 115. A surface opposite to the first surface 102 of the first semiconductor substrate 120 is referred to as the second surface 104.

FIG. 14 illustrates attaching of the first connection units 130 to the first semiconductor substrate 120 to manufacture a stacked semiconductor package according to an embodiment of the present general inventive concept.

Referring to FIG. 14, the first pad 122 and the first pad protection layer 124 are formed on the second surface 104 of the first semiconductor substrate 120. The first pad 122 may be electrically connected to the first penetration electrodes 115. Accordingly, the first pad 122 may be electrically connected to the first semiconductor device 110 and the remaining portions of the first pad 122 may be electrically insulated from the first semiconductor device 110. The first pads 122 may be partially exposed by the first pad protection layer 124 and the first connection units 130 may be attached to the exposed portions of the first pad 122. Accordingly, manufacturing of the first semiconductor chip 100b may be completed.

Figure 15:
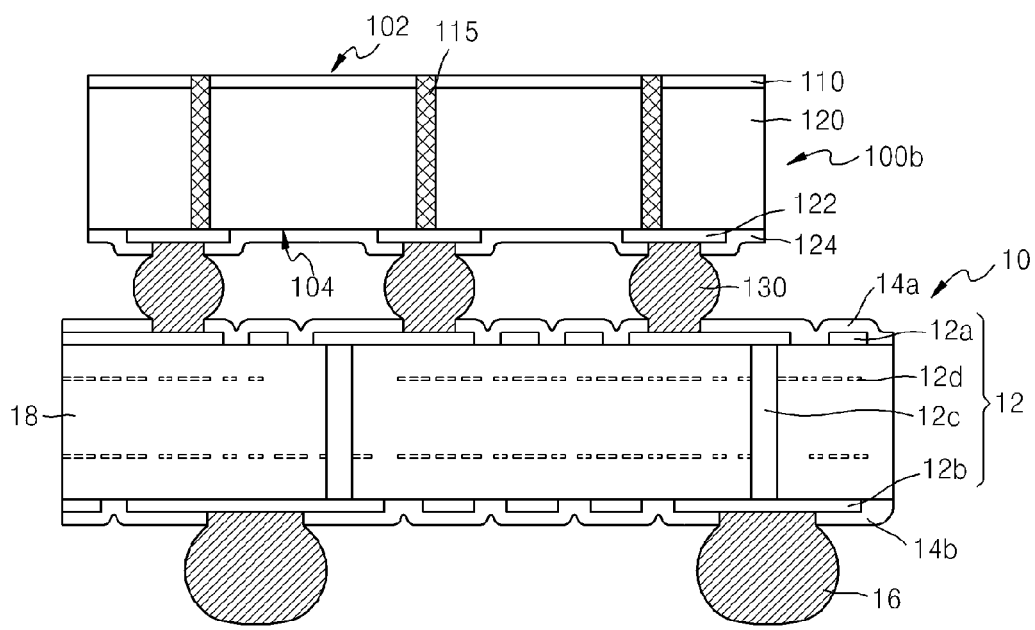
FIG. 15 is a cross-sectional view schematically illustrating the first semiconductor chip of FIG. 14 attached on the first printed circuit board of FIG. 2 to manufacture a stacked semiconductor package according to an embodiment of the present general inventive concept.

FIG. 15 is a cross-sectional view schematically illustrating the first semiconductor chip 100b attached on the first printed circuit board 10 to manufacture a stacked semiconductor package according to an embodiment of the present general inventive concept. More specifically, FIG. 15 illustrates the first semiconductor chip 100b of FIG. 14 as the first semiconductor chip 100 of FIG. 2.

Referring to FIG. 15, the first semiconductor chip 100b is attached on the first printed circuit board 10. Here, the first connection units 130 may be interposed between the first semiconductor chip 100b and the printed circuit board 10. That is, the first semiconductor chip 100b may be attached to the first printed circuit board 10 in such a way that the second surface 104 of the first semiconductor chip 100b faces the first printed circuit board 10.

Comparing FIG. 11 to FIG. 15, a difference between FIGS. 11 and 15 is similar to a difference between the second semiconductor chips 200 and 200a of FIGS. 4 and 5. Also, the first semiconductor chip 100a of FIG. 11 and the first semiconductor chip 100b of FIG. 15 may be commonly referred to as the first semiconductor chip 100 and thus reference numerals and names of elements are commonly illustrated.

Figure 16:
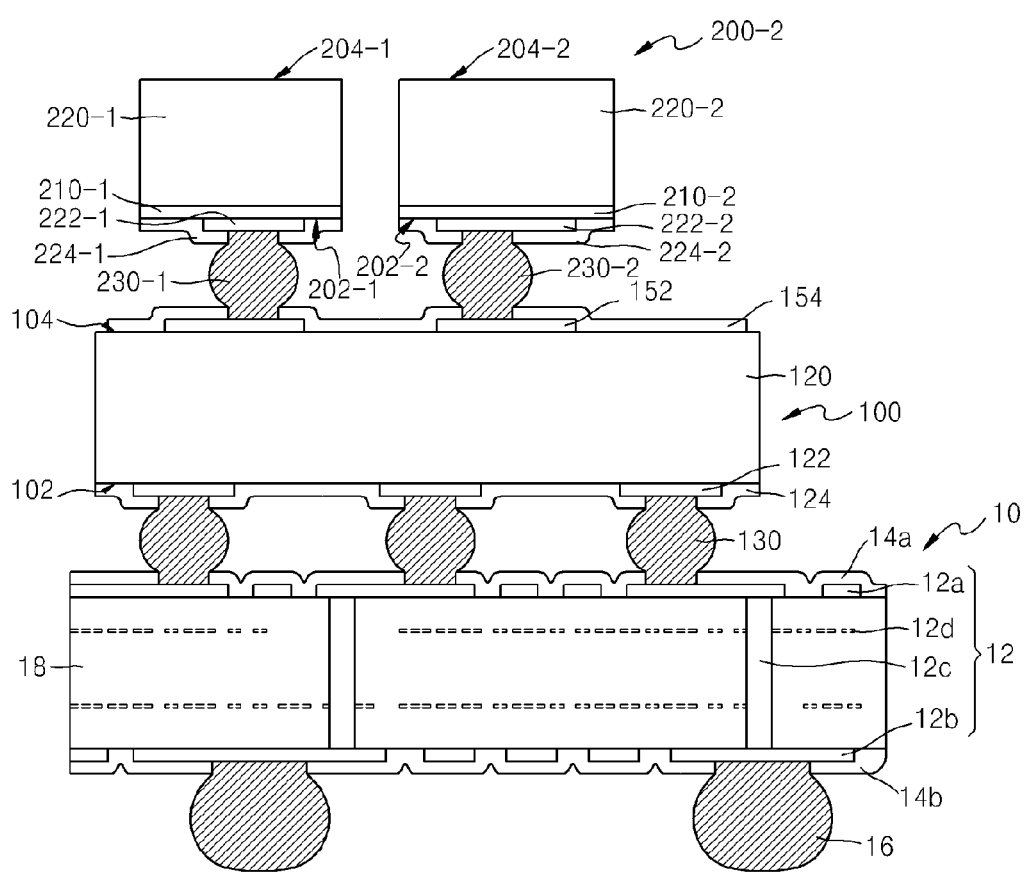
FIG. 16 is a cross-sectional view schematically illustrating second semiconductor chips attached on the first semiconductor chip of FIG. 2 to manufacture a stacked semiconductor package according to an embodiment of the present general inventive concept.

FIG. 16 is a cross-sectional view schematically illustrating second semiconductor chips 200-1 and 200-2 attached on the first semiconductor chip 100 to manufacture a stacked semiconductor package according to an embodiment of the present general inventive concept.

Referring to FIG. 16, the two second semiconductor chips 200-1 and 200-2 are attached and stacked on the first semiconductor chip 100. Here, the two second semiconductor chips 200-1 and 200-2 may be the same as each other or may be the same kind of semiconductor chip. Also, different types of semiconductor chips may be attached and stacked. Although not illustrated, a plurality of second semiconductor chips may be attached on the first semiconductor chip 100.

Also, the two second semiconductor chips 200-1 and 200-2 have a form similar to that of the second semiconductor chip 200 of FIG. 4. However, semiconductor chips having a form similar to that of the second semiconductor chip 200a of FIG. 5 may be attached and stacked or semiconductor chips having forms similar to those of second semiconductor chips 200 and 200a of FIGS. 4 and 5 may be attached and stacked.

In addition, portions of the first connection units 130 of the first semiconductor chip 100 may electrically connect the first semiconductor device (not illustrated) included in the semiconductor chip 100 to the first conductive wiring 12 of the first printed circuit board 10. Other portions of the first connection units 130 of the first semiconductor chip 100 may electrically connect second semiconductor devices 210-1 and 210-2 to the first conductive wiring 12 of the first printed circuit board 10.

Figure 17:
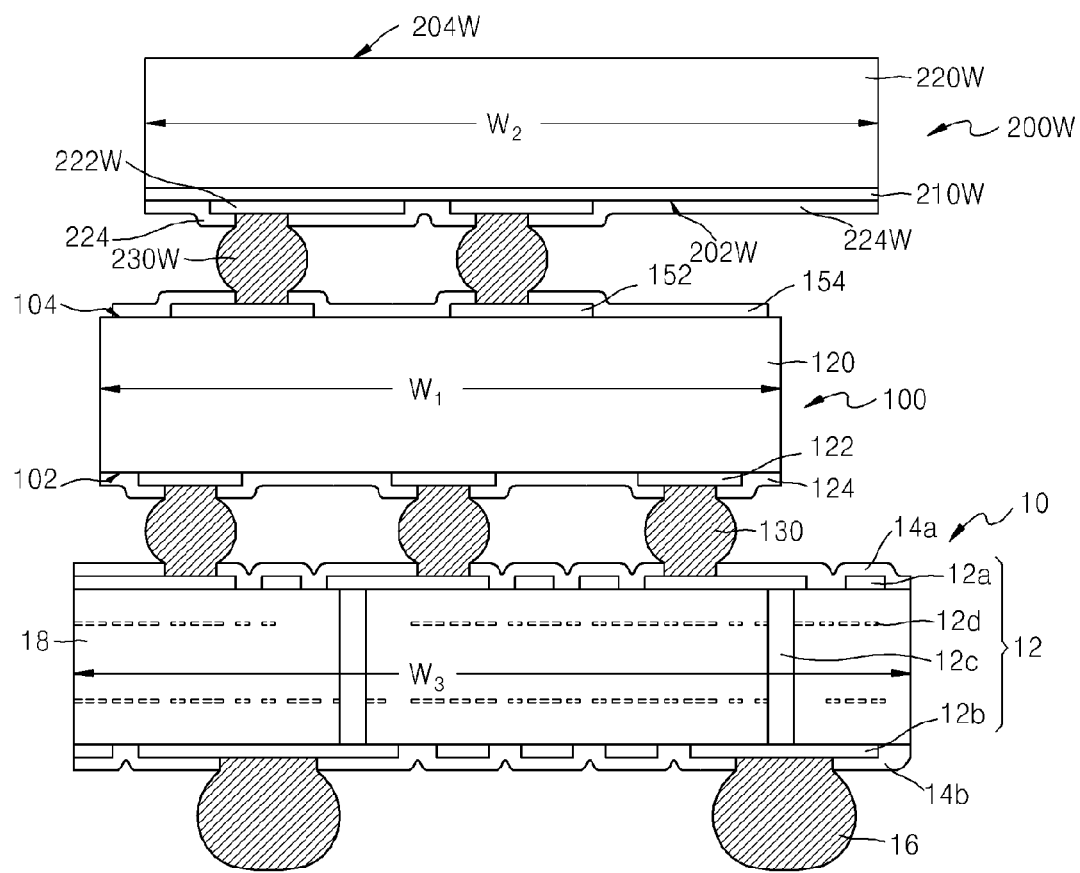
FIG. 17 is a cross-sectional view schematically illustrating a second semiconductor chip attached on the first semiconductor chip of FIG. 2 to manufacture a stacked semiconductor package according to another embodiment of the present general inventive concept.

FIG. 17 is a cross-sectional view schematically illustrating a second semiconductor chip 200W attached on the first semiconductor chip 100 to manufacture a stacked semiconductor package according to another embodiment of the present general inventive concept.

Referring to FIG. 17, the second semiconductor chip 200W having a second width W2 that is greater than a first width W1 of the first semiconductor chip 100 is attached on the first semiconductor chip 100. Here, only a width is illustrated; however, a surface on which a second semiconductor device 210W of the second semiconductor chip 200W is formed is larger than the first and second surfaces 102 and 104 of the first semiconductor chip 100, that is, a surface of the first semiconductor chip 100 on which the first semiconductor device is formed.

Here, the first semiconductor chip 100 and the second semiconductor chip 200W may be attached on the first printed circuit board 10 having a third width W3 that is greater than the first width W1 and the second width W2. That is, a surface of the first printed circuit board 10 on which the first semiconductor chip 100 is attached is larger than the surface of the first semiconductor chip 100 on which the first semiconductor device is formed and the surface of the second semiconductor chip 200W on which the second semiconductor device 210W is formed.

In other words, if the printed circuit board 10 has the largest area, semiconductor chips having smaller surface areas than the first printed circuit board 10 having the largest area may be attached and stacked on the first printed circuit board 10 regardless of sizes of the surfaces of the semiconductor chips.

Figure 18:
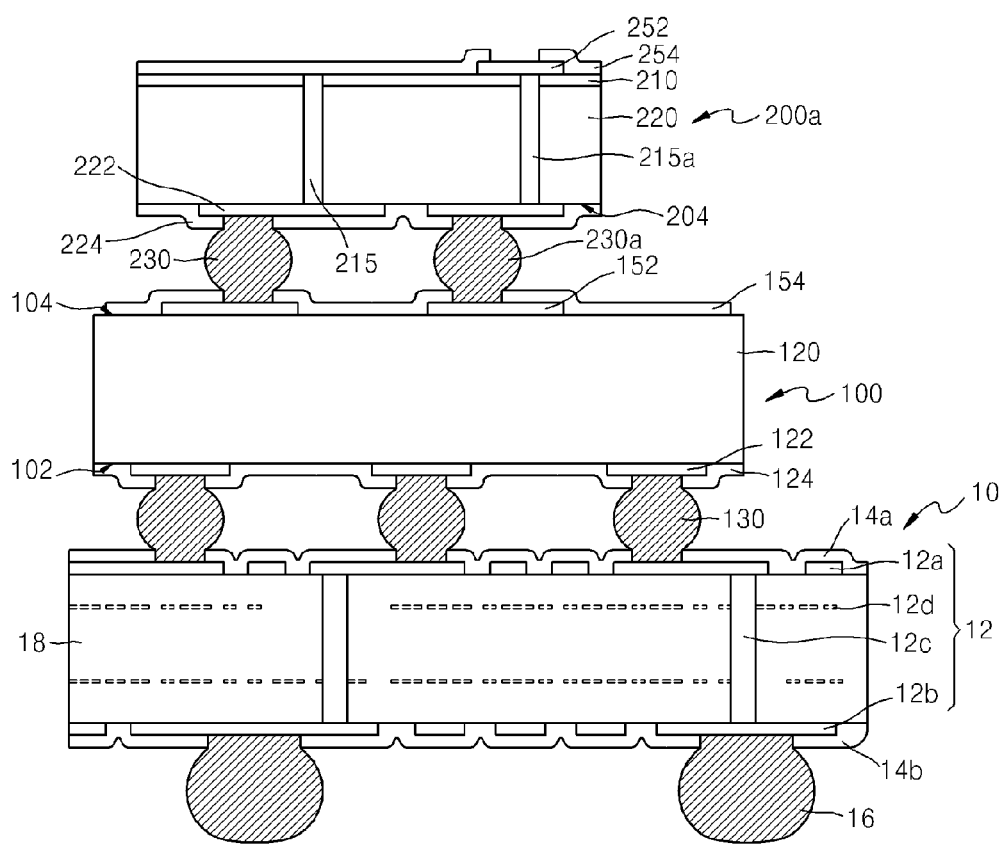
FIG. 18 is a cross-sectional view schematically illustrating a second rewiring pattern and a second protection layer formed on the second semiconductor chip of FIG. 5 to manufacture a stacked semiconductor package according to an embodiment of the present general inventive concept.

FIG. 18 is a cross-sectional view schematically illustrating a second rewiring pattern 252 and a second protection layer 254 formed on the second semiconductor chip 200a to manufacture a stacked semiconductor package according to an embodiment of the present general inventive concept.

Referring to FIG. 18, the second rewiring pattern 252 and the second protection layer 254 are formed on the one side 202 of the second semiconductor substrate 220 of the second semiconductor chip 200a by using a printing method. The printing method may be, for example, an inkjet printing method or a stencil printing method.

Here, the second semiconductor chip 200a may include the second penetration electrodes 215 and second auxiliary penetration electrodes 215a. The second penetration electrodes 215 may be electrically connected to the second connection units 230 and the second semiconductor device 210. Also, the second auxiliary penetration electrodes 215a may electrically connect the second rewiring pattern 252 to second auxiliary connection units 230a.

In addition, the second semiconductor chip 200a may be attached on the first semiconductor chip 100 with the second connection units 230 and the second auxiliary connection units 230a interposed therebetween.

The second rewiring pattern 252 and the second protection layer 254 may be formed in the same manner as in the forming of the first rewiring pattern 152 and the first protection layer 154 illustrated in FIG. 3. Thus, a detailed description thereof is omitted.

Here, exposed portions of the second rewiring pattern 252 may be used to test the second semiconductor chip 200a attached to the first semiconductor chip 100. Accordingly, a fail of the second semiconductor chip 200a or a contact fail between the second semiconductor chip 200a and the first semiconductor chip 100, which may be generated while attaching the second semiconductor chip 200a to the first semiconductor chip 100, may be determined. Thus, defective products may be removed before attaching a third semiconductor chip, which will be described later, to the second semiconductor chip 200a and thus productivity may be improved.

Figure 19:
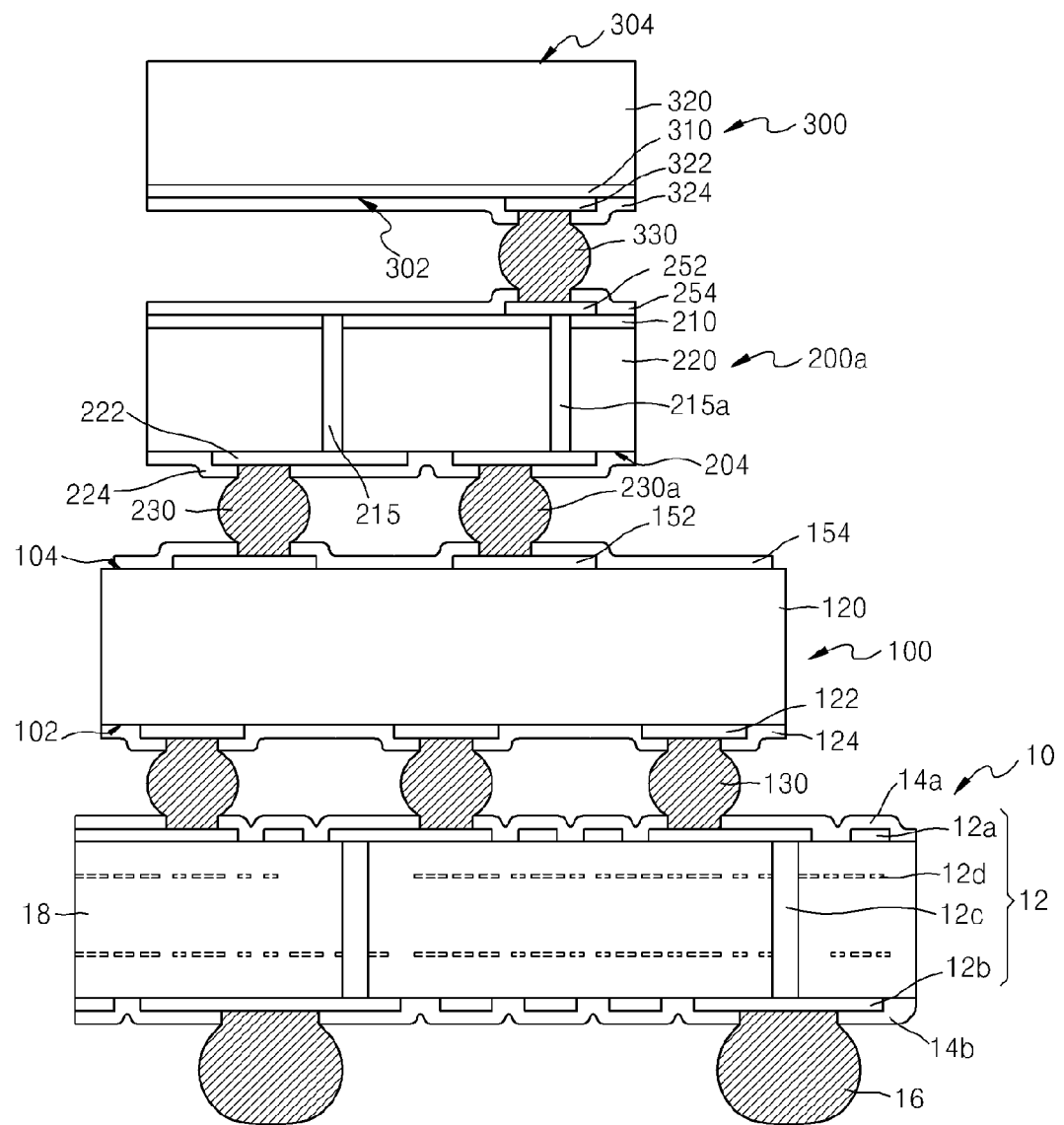
FIG. 19 is a cross-sectional view schematically illustrating a third semiconductor chip attached on the second semiconductor chip of FIG. 5 according to an embodiment of the present general inventive concept.

FIG. 19 is a cross-sectional view schematically illustrating a third semiconductor chip 300 attached on the second semiconductor chip 200a according to an embodiment of the present general inventive concept.

Referring to FIG. 19, the third semiconductor chip 300 is attached on the second semiconductor chip 200a. The third semiconductor chip 300 may include a third semiconductor substrate 320, a third pad 322, a third pad protection layer 324, and third connection units 330, wherein the third pad 322, the third pad protection layer 324, and the third connection units 330 are formed on one side 302 of the third semiconductor substrate 320. A third semiconductor device 310 included in the third semiconductor chip 300 may be electrically connected to the second semiconductor device 210 or the second auxiliary penetration electrodes 215a through the third pad 322 and the third connection units 330.

Also, the third semiconductor device 310 is electrically connected to the first semiconductor chip 100 or the first printed circuit board 10 through the second auxiliary penetration electrodes 215a and the second auxiliary connection units 230a. Also, the second semiconductor device 210 may be electrically connected to the first semiconductor chip 100 or the first printed circuit board 10 through the second penetration electrodes 215 and the second connection units 230.

Although not illustrated, the third pad 322, the third pad protection layer 324, and the third connection unit 330 may be formed on the other side 304 of the third semiconductor substrate 320 as similarly illustrated in FIGS. 4 and 5.

Figure 20:
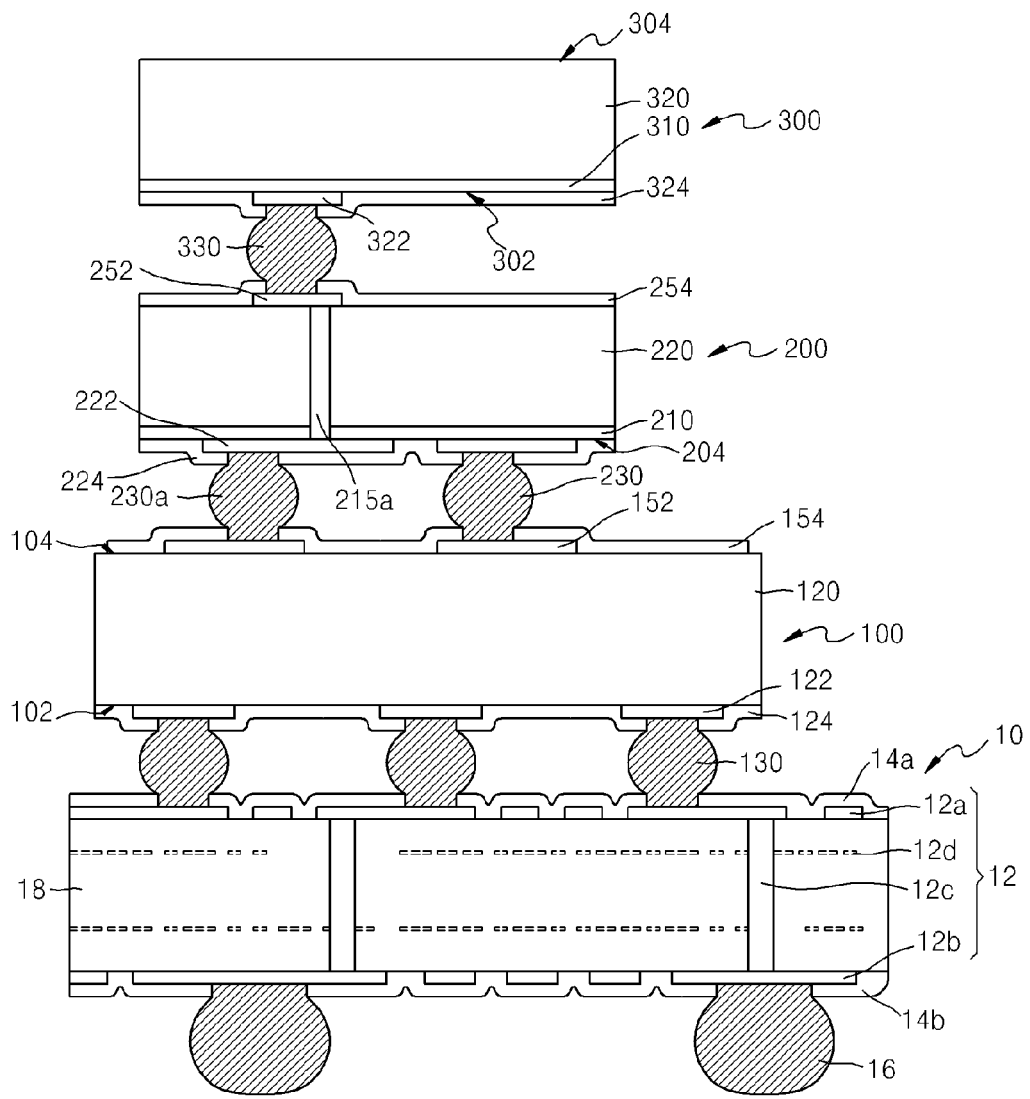
FIG. 20 is a cross-sectional view schematically illustrating the third semiconductor chip of FIG. 19 attached on the second semiconductor chip of FIG. 4 according to another embodiment of the present general inventive concept.

FIG. 20 is a cross-sectional view schematically illustrating the third semiconductor chip 300 attached on the second semiconductor chip 200 according to another embodiment of the present general inventive concept.

Referring to FIG. 20, the third semiconductor chip 300 is attached on the second semiconductor chip 200. In FIG. 19, the second semiconductor device 210 of the second semiconductor chip 200a is disposed to face the third semiconductor chip 300, whereas in FIG. 20, the second semiconductor device 210 of the second semiconductor chip 200 is disposed to face the first semiconductor chip 100. Other structures illustrated in FIGS. 19 and 20 are the same as each other and thus a detailed description thereof is omitted.

However, the second semiconductor device 210 may be electrically connected to the second connection units 230 without using an electrode penetrating the second semiconductor substrate 220, whereas the third semiconductor device 310 may be electrically connected to the second auxiliary connection unit 230a through the second auxiliary penetration electrodes 215a penetrating the second semiconductor substrate 220.

As such, penetration electrodes penetrating a semiconductor substrate may be used for a semiconductor device formed on the semiconductor substrate or may be used for a semiconductor device included in another semiconductor chip to be additionally stacked. If uses thereof are not particularly specified, these electrodes may be commonly referred to as penetration electrodes.

As described above, in the first semiconductor chips 100, 100a, and 100b, the second semiconductor chips 200 and 200a, or the third semiconductor chip 300, the semiconductor devices included in each of the first semiconductor chips 100, 100a, and 100b, the second semiconductor chips 200 and 200a, and the third semiconductor chip 300, that is, the first semiconductor device 110, the second semiconductor device 210, and the third semiconductor device 310, may be disposed to be adjacent to the first printed circuit board 10 or to be far from the first printed circuit board 10, as determined according to characteristics of stacked semiconductor chips and connection characteristics.

FIGS. 21 through 25 are cross-sectional views illustrating a method of manufacturing a stacked semiconductor package according to another embodiment of the present general inventive concept.

Figure 21:
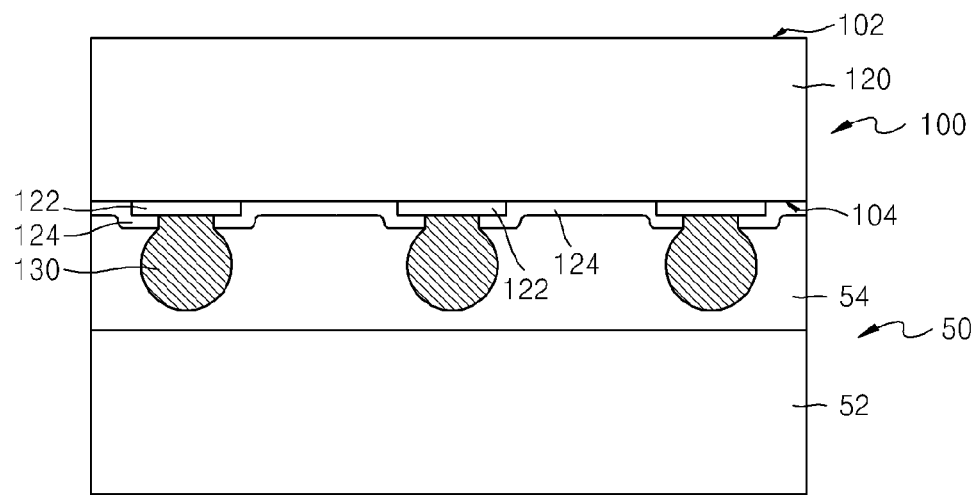
FIGS. 21 through 25 are cross-sectional views illustrating a method of manufacturing a stacked semiconductor package according to another embodiment of the present general inventive concept.

FIG. 21 illustrates attaching of the first semiconductor chip 100 to a temporary carrier 50 according to another embodiment of the present general inventive concept.

Referring to FIG. 21, the first semiconductor chip 100 is attached on the temporary carrier 50 including a glue layer 54 and a temporary substrate 52. The temporary carrier 50 may be attached to the first semiconductor chip 100 by using the glue layer 54, which is elastic and formed on the temporary substrate 52.

Here, the glue layer 54 is elastic and thus may surround at least part of the first connection units 130 when attaching to the first semiconductor chip 100.

Figure 22:
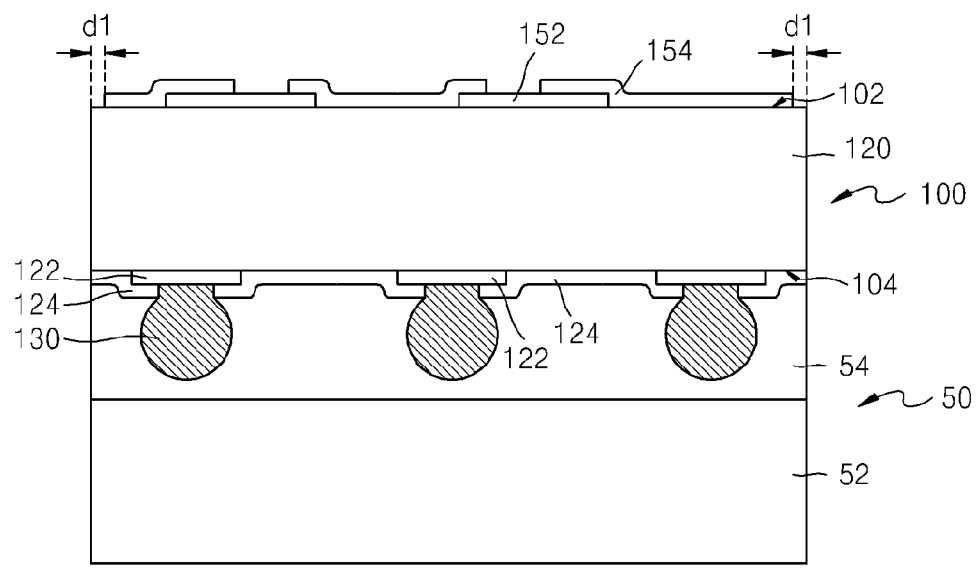

FIG. 22 illustrates formation of the first rewiring pattern 152 and the first protection layer 154 to manufacture a stacked semiconductor package according to another embodiment of the present general inventive concept.

Referring to FIG. 22, the first rewiring pattern 152 and the first protection layer 154 are formed on one side 102 of the first semiconductor substrate 120 of the first semiconductor chip 100 by using a printing method and may be formed in a manner similar to forming of the first rewiring pattern 152 and the first protection layer 154 illustrated in FIG. 3. Thus, a detailed description thereof is omitted.

Figure 23:
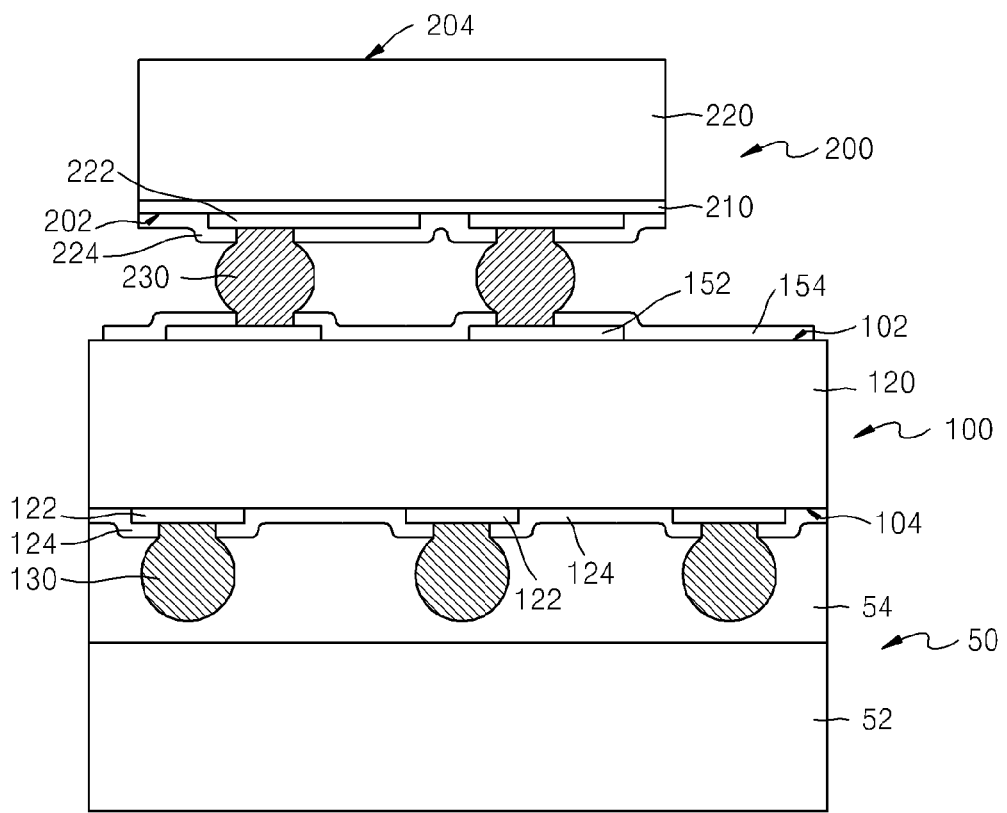

FIG. 23 illustrates attaching of the second semiconductor chip 200 on the first semiconductor chip 100 to manufacture a stacked semiconductor package according to another embodiment of the present general inventive concept.

Referring to FIG. 23, the second semiconductor chip 200 is attached on the first semiconductor chip 100. The second semiconductor chip 200 may include the second pad 222, the second pad protection layer 224, and the second connection units 230 formed on the one side 202 of the second semiconductor substrate 220. The second semiconductor device 210 included in the second semiconductor chip 200 may be electrically connected to the first semiconductor chip 100 through the second pad 222 and the second connection units 230.

Comparing FIG. 4 to FIG. 23, FIG. 4 and FIG. 23 are the same as each other in that the first rewiring pattern 152 and the first protection layer 154 are formed, and in that the first printed circuit board 10 of FIG. 4 and the temporary carrier 50 of FIG. 23 both function as a support in attaching the second semiconductor chip 200 to the first semiconductor chip 100, and are different from each other in that the temporary carrier 50 is used in FIG. 23 and the first printed circuit board 10 is used in FIG. 4. Accordingly, the first printed circuit board 10 and the temporary carrier 50 function may be commonly referred to as a base substrate.

Figure 24:
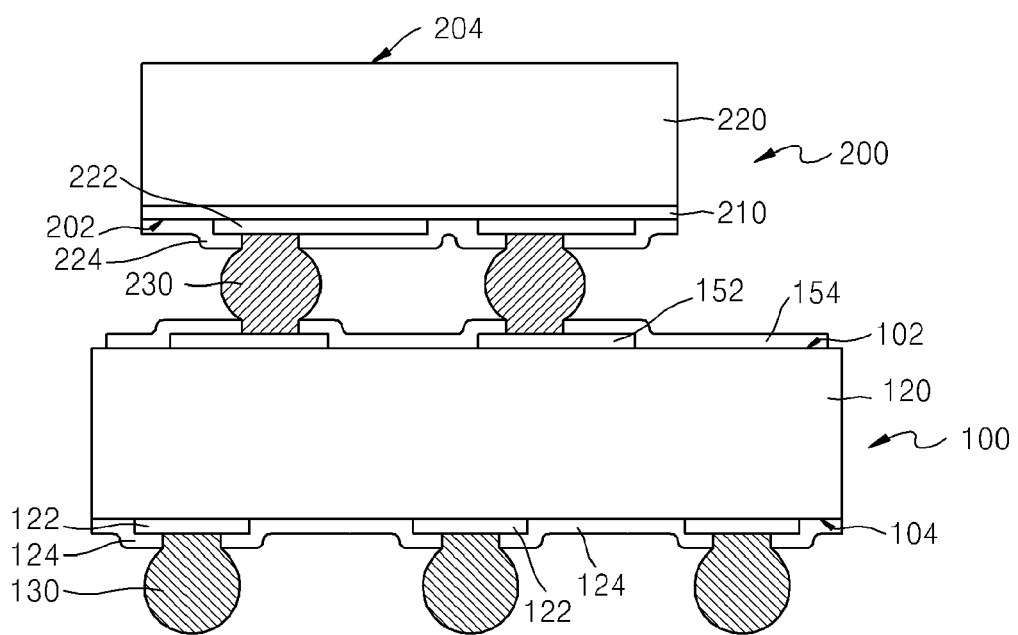

FIG. 24 illustrates removal of the temporary carrier 50 to manufacture a stacked semiconductor package according to another embodiment of the present general inventive concept.

Referring to FIGS. 23 and 24, the second semiconductor chip 200 is attached on the first semiconductor chip 100 and then the temporary carrier 50 may be removed. The glue layer 54, which allows the first semiconductor chip 100 to be attached on the temporary carrier 50, may be formed of a material that is easily separated from the first semiconductor chip 100.

In a method of manufacturing a stacked semiconductor package according to another embodiment of the present general inventive concept, the first semiconductor chip 100 is attached to the temporary carrier 50 and then a process requiring strong adhesive strength such as back side grinding may not be performed. Accordingly, the glue layer 54 may relatively have a low adhesive strength so that it is easy to select a material that is easily separated from the first semiconductor chip 100.

Figure 25:
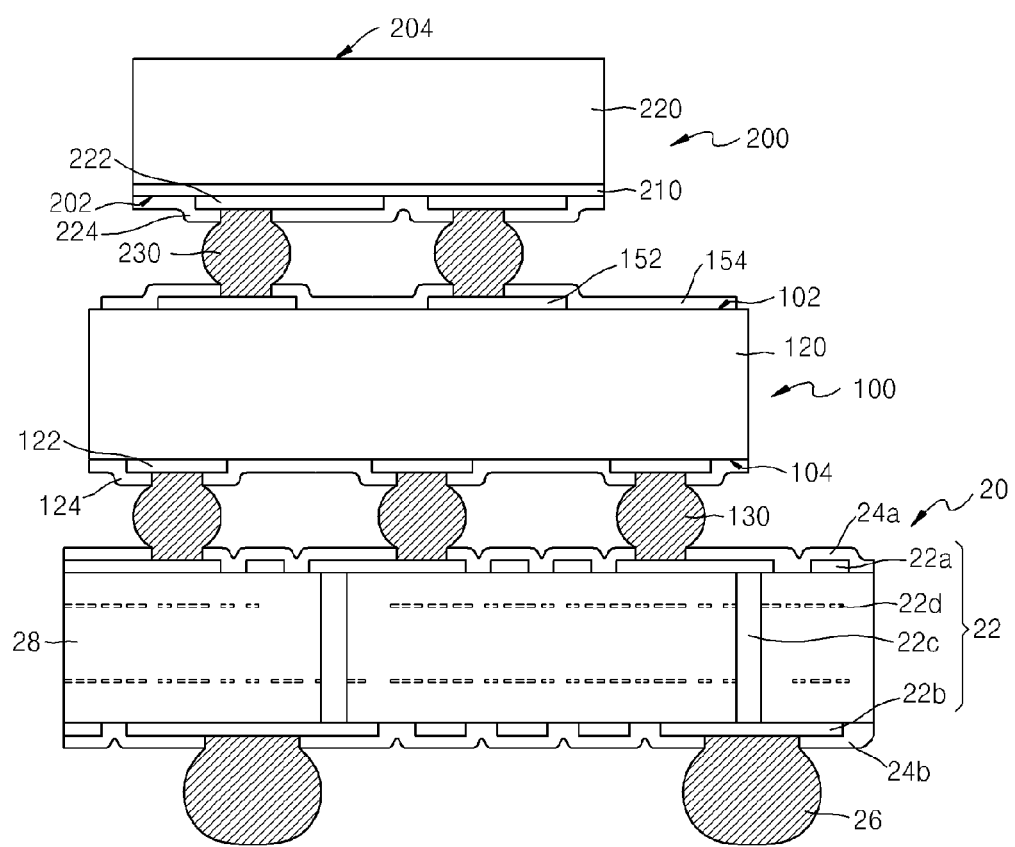

FIG. 25 illustrates the first semiconductor chip 100, to which the second semiconductor chip 200 is attached, attached to a second printed circuit board 20 to manufacture a stacked semiconductor package according to another embodiment of the present general inventive concept.

Referring to FIG. 25, the first semiconductor chip 100, to which the second semiconductor chip 200 is attached, is attached to the second printed circuit board 20. Such a process is similar to the attaching of the first semiconductor chip 100 to the first printed circuit board 10 illustrated in FIG. 2 and thus a detailed description thereof is omitted.

As a succeeding process, the second rewiring pattern 252 and the second protection layer 254 may be formed as illustrated in FIGS. 18 through 20 and then attaching of the third semiconductor chip 300 to the second semiconductor chip 200 may also be performed.

Figure 26:
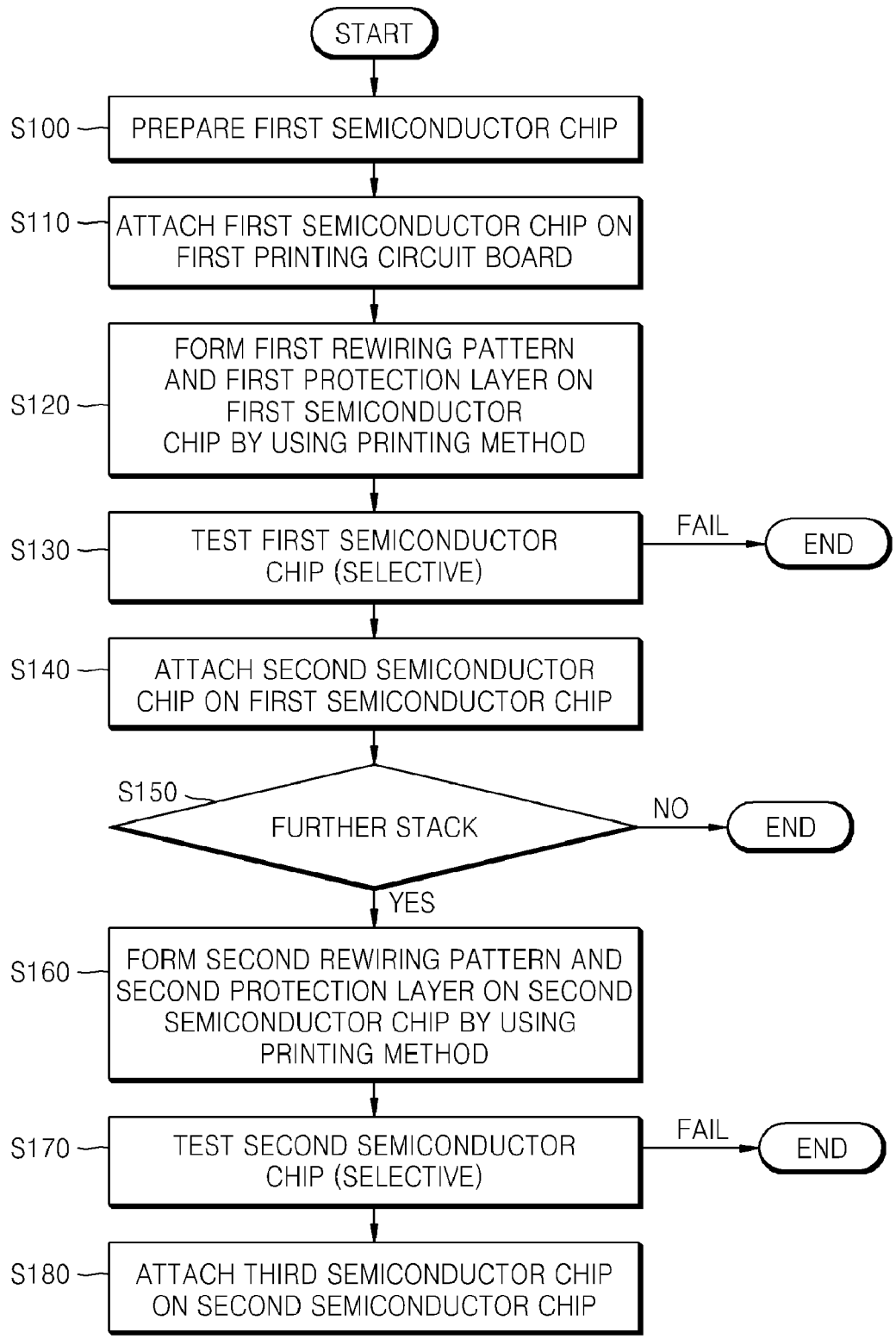
FIG. 26 is a flowchart schematically illustrating a method of manufacturing a stacked semiconductor package according to an embodiment of the present general inventive concept.

FIG. 26 is a flowchart schematically illustrating a method of manufacturing a stacked semiconductor package according to an embodiment of the present general inventive concept. Hereinafter, details described with reference to FIGS. 1 through 20 are also referred to in describing FIG. 26.

Referring to FIG. 26, the first semiconductor chip 100 is prepared to manufacture a stacked semiconductor package, in operation S100. Preparation of the first semiconductor chip 100 is described in detail in FIGS. 6 through 10 and FIGS. 12 through 14. The first semiconductor chip 100 is attached on the first printed circuit board 10, in operation S110. The first rewiring pattern 152 and the first protection layer 154 may then be formed on the first semiconductor chip 100 by using a printing method, in operation S120. The first rewiring pattern 152 may be used to selectively test the first semiconductor chip 100, in operation S130. When the test determines that a fail has been generated, in operation S130, manufacturing of a stacked semiconductor package may be stopped.

When the test determines that a fail has not been generated in the first semiconductor chip 100, in operation S130, the second semiconductor chip 200 is attached and stacked on the first semiconductor chip 100, in operation S140. According to whether to further stack a semiconductor chip, the process may then be continuously performed or completed, in operation S150.

When a semiconductor chip is further stacked, the second rewiring pattern 252 and the second protection layer 254 are formed on the second semiconductor chip 200 by using a printing method, in operation S160. Also, the second rewiring pattern 252 may be used to selectively test the second semiconductor chip 200, in operation S170. When the test determines that a fail has been generated in the second semiconductor chip 200, in operation S170, manufacturing of a stacked semiconductor package may be stopped. If a semiconductor chip is not further stacked, the second rewiring pattern 252 and the second protection layer 254 may be formed on the second semiconductor chip 200 by using a printing method of testing the second semiconductor chip 200, in operation S160.

When the test determines that a fail has not been generated in the second semiconductor chip 200, in operation S170, the third semiconductor chip 300 is attached and stacked on the second semiconductor chip 200, in operation S180.

Figure 27:
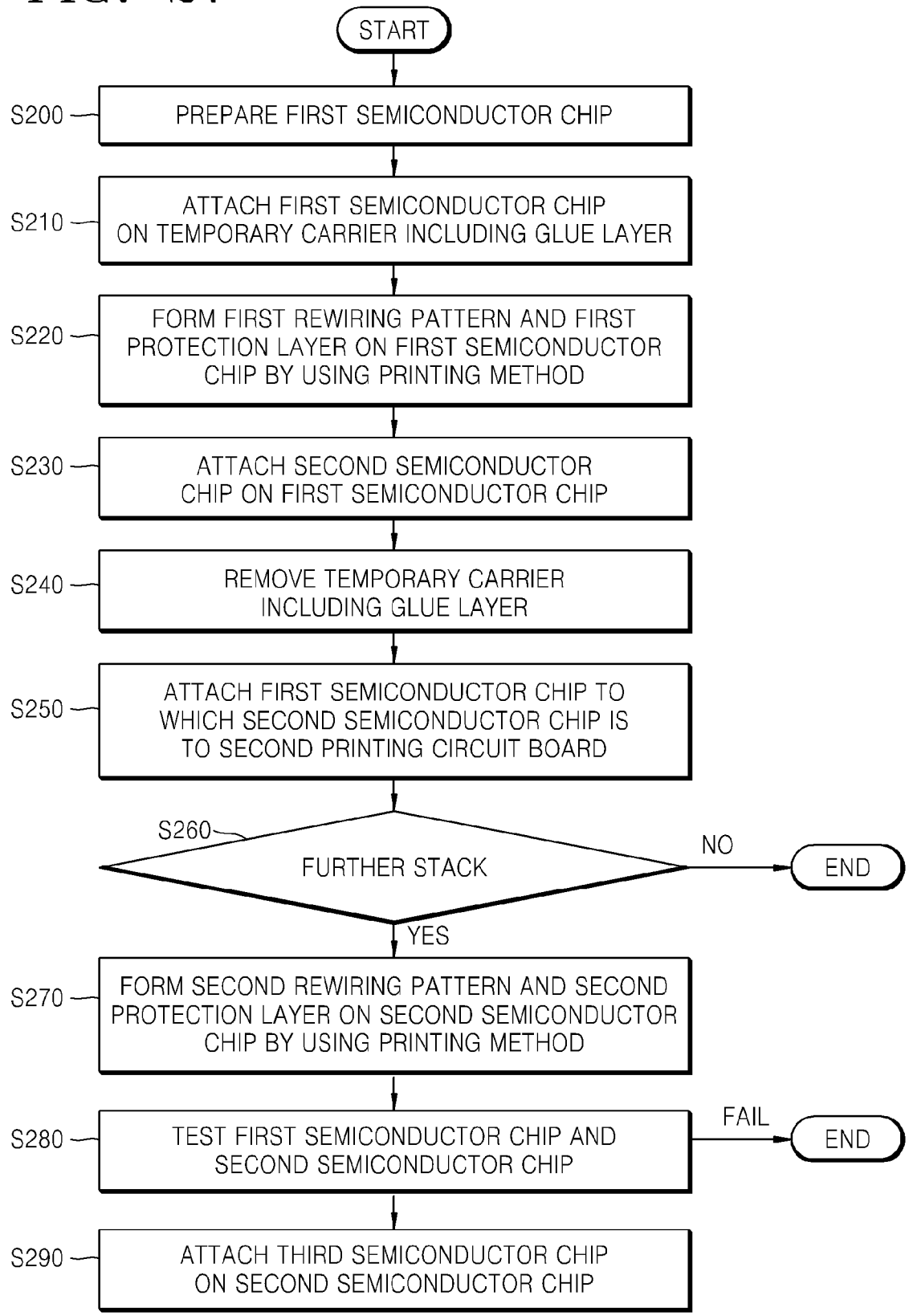
FIG. 27 is a flowchart schematically illustrating a method of manufacturing a stacked semiconductor package according to another embodiment of the present general inventive concept.

FIG. 27 is a flowchart schematically illustrating a method of manufacturing a stacked semiconductor package according to another embodiment of the present general inventive concept. Hereinafter, details described with reference to FIGS. 21 through 25 are also referred to in describing FIG. 27.

Referring to FIG. 27, the first semiconductor chip 100 is prepared to manufacture a stacked semiconductor package, in operation S200. The first semiconductor chip 100 is attached on the temporary carrier 50, in operation S210. The first rewiring pattern 152 and the first protection layer 154 may then be formed on the first semiconductor chip 100 by using a printing method, in operation S220. The second semiconductor chip 200 is attached and stacked on the semiconductor chip 100, in operation S230. After the second semiconductor chip 200 is attached on the first semiconductor chip 100, the temporary carrier 50 is removed from the first semiconductor chip 100, in operation S240, and the first semiconductor chip 100, to which the second semiconductor chip 200 is attached, is attached on the second printed circuit board 20, in operation S250.

According to whether to further stack a semiconductor chip, the process may then be continuously performed or completed, in operation S260. When a semiconductor chip is further stacked, the second rewiring pattern 252 and the second protection layer 254 are formed on the second semiconductor chip 200 by using a printing method, in operation S270. Here, the second rewiring pattern 252 may be used to selectively test the second semiconductor chip 200, in operation S280. When the test determines that a fail has been generated in the second semiconductor chip 200, in operation S280, manufacturing of a stacked semiconductor package may be stopped. If a semiconductor chip is not further stacked, the second rewiring pattern 252 and the second protection layer 254 may be formed on the second semiconductor chip 200 by using a printing method of testing the second semiconductor chip 200, in operation S270.

When the test determines that a fail has not been generated in the second semiconductor chip 200, in operation S280, the third semiconductor chip 300 is attached and stacked on the second semiconductor chip 200, in operation S290.

The methods of manufacturing a stacked semiconductor package according to embodiments of the present general inventive concept are described above with reference to FIGS. 1 through 27. Here, use of filler may further be applied in a space between the first semiconductor chip 100 and the first printed circuit board 10 or the second printed circuit board 20 or spaces between the first through third semiconductor chips 100, 200, and 300. Also, forming of molding resin that surrounds the entire stacked semiconductor package may be further performed.

In the method of manufacturing a stacked semiconductor package according to the present general inventive concept, a separate temporary carrier may not be used or an easily detachable temporary carrier may be used to complete manufacture of a stacked semiconductor package.

Also, a test for the stacked semiconductor chip may be performed during manufacturing of the stacked semiconductor package and thus a fail rate of the completed stacked semiconductor package may be reduced.

While the present general inventive concept has been particularly shown and described with reference to exemplary embodiments thereof, it will be understood that various changes in form and details may be made therein without departing from the spirit and scope of the following claims.

What is claimed is:

1. A method of manufacturing a stacked semiconductor package, the method comprising:
    preparing a first semiconductor chip comprising a first semiconductor substrate and a first semiconductor device disposed on a first side of the first semiconductor substrate, a first penetration electrode, and a first connection unit electrically connected to the first semiconductor device or the first penetration electrode;
    attaching the first semiconductor chip to a base substrate with the first connection unit interposed therebetween;
    forming a first rewiring pattern and a first protection layer on a second side of the semiconductor substrate of the first semiconductor chip by using a printing method, wherein the first rewiring pattern is electrically connected to the first penetration electrode and the first protection layer partially covers the first rewiring pattern and exposes other portions of the first rewiring pattern; and
    attaching a second semiconductor chip comprising a second semiconductor device to the first semiconductor chip to electrically connect the second semiconductor device to the first rewiring pattern,
    wherein the first penetration electrode is formed to extend through the first semiconductor substrate and the first semiconductor device.

2. The method of claim 1, wherein the first semiconductor chip comprises a first surface and a second surface that is opposite to the first surface, the first semiconductor device and the first connection unit are formed on the first surface, and wherein, in the attaching of the first semiconductor chip to the base substrate, the first surface faces the base substrate.

3. The method of claim 2, wherein the forming of the first rewiring pattern and the first protection layer by using a printing method comprises forming the first rewiring pattern and the first protection layer on the second surface of the first semiconductor chip and wherein attaching of the second semiconductor chip to the first semiconductor chip comprises attaching the second semiconductor chip to the second surface of the first semiconductor chip.

4. The method of claim 1, wherein the base substrate is a first printed circuit board comprising a first conductive wiring and wherein the attaching of the first semiconductor chip to the base substrate comprises electrically connecting the first connection unit to the first conductive wiring.

5. The method of claim 4, wherein the second semiconductor chip further comprises second connection units that are electrically connected to the second semiconductor device, and the second semiconductor device is electrically connected to the first conductive wiring through the second connection units, the first penetration electrode, and the first connection unit.

6. The method of claim 4, further comprising testing the first semiconductor chip attached to the first printed circuit board before the attaching of the second semiconductor chip to the first semiconductor chip.

7. The method of claim 1, wherein the printing of the first rewiring pattern and the first protection layer comprises inkjet printing or stencil printing.

8. The method of claim 1, wherein a surface of the second semiconductor chip on which the second semiconductor device is formed is larger than a surface of the first semiconductor chip on which the first semiconductor device is formed.

9. The method of claim 8, wherein a surface of the base substrate to which the first semiconductor chip is attached is larger than the surface of the second semiconductor chip on which the second semiconductor device is formed.

10. The method of claim 1, wherein, in the forming of the first rewiring pattern and the first protection layer by using a printing method, the first protection layer is formed to be spaced apart from an edge of a surface of the first semiconductor chip on which the first rewiring pattern and the first protection layer are formed.

* * * * *